United States Patent
Sasaki et al.

(10) Patent No.: US 6,224,679 B1
(45) Date of Patent: May 1, 2001

(54) CONTROLLING GAS IN A MULTICHAMBER PROCESSING SYSTEM

(75) Inventors: Yoshiaki Sasaki, Tamaho-cho; Teruo Asakawa, Ryuo-cho, both of (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/131,280

(22) Filed: Aug. 10, 1998

(30) Foreign Application Priority Data

Aug. 12, 1997 (JP) .................................................... 9-230221

(51) Int. Cl.$^7$ .................................................... C23C 16/00
(52) U.S. Cl. ............................ 118/719; 156/345; 414/935
(58) Field of Search .............................. 118/719; 156/345; 414/935, 937, 938, 940

(56) References Cited

U.S. PATENT DOCUMENTS

| | | | | |
|---|---|---|---|---|
| 5,551,984 | * | 9/1996 | Tanahashi | 118/724 |
| 5,562,383 | * | 10/1996 | Iwai et al. | 414/217 |
| 5,565,034 | * | 10/1996 | Nanbu et al. | 118/668 |
| 5,609,459 | | 3/1997 | Muka | 414/217 |
| 5,626,820 | * | 5/1997 | Kinkead et al. | 422/122 |
| 5,752,985 | * | 5/1998 | Nagafune et al. | 29/25.01 |
| 5,909,994 | * | 6/1999 | Blum et al. | 118/719 |
| 5,944,894 | * | 8/1999 | Kitano et al. | 118/326 |
| 6,017,395 | * | 1/2000 | Matuno et al. | 118/715 |
| 6,053,058 | * | 4/2000 | Hayashi et al. | 73/863.01 |
| 6,120,584 | * | 9/2000 | Sakata et al. | 96/135 |

FOREIGN PATENT DOCUMENTS

| | | |
|---|---|---|
| 49940/1994 | 6/1988 | (JP) . |
| 2-128421 | 5/1990 | (JP) . |
| 6-177225 | 6/1994 | (JP) . |
| 7-335711 | 12/1995 | (JP) . |
| 8-148551 | 6/1996 | (JP) . |

* cited by examiner

*Primary Examiner*—Jeffrie R. Lund
*Assistant Examiner*—Sylvia R. MacArthur
(74) *Attorney, Agent, or Firm*—Smith, Gambrell & Russell, LLP

(57) ABSTRACT

A wafer processing system comprises a container-housing chamber for housing the conveying container conveyed from the common area, a cleaning chamber disposed adjacent to the container-housing chamber, and a load-lock chamber disposed adjacent to the cleaning chamber. The cleaning chamber has an inlet line for introducing a clean gas into the cleaning chamber and a pressure control means for controlling the pressure in the cleaning chamber. The load-lock chamber has a conveying unit capable of extending to the container-housing chamber through the cleaning chamber, in order to take out the object from the conveying container housed in the container-housing chamber to the load-lock chamber through the cleaning chamber.

4 Claims, 4 Drawing Sheets

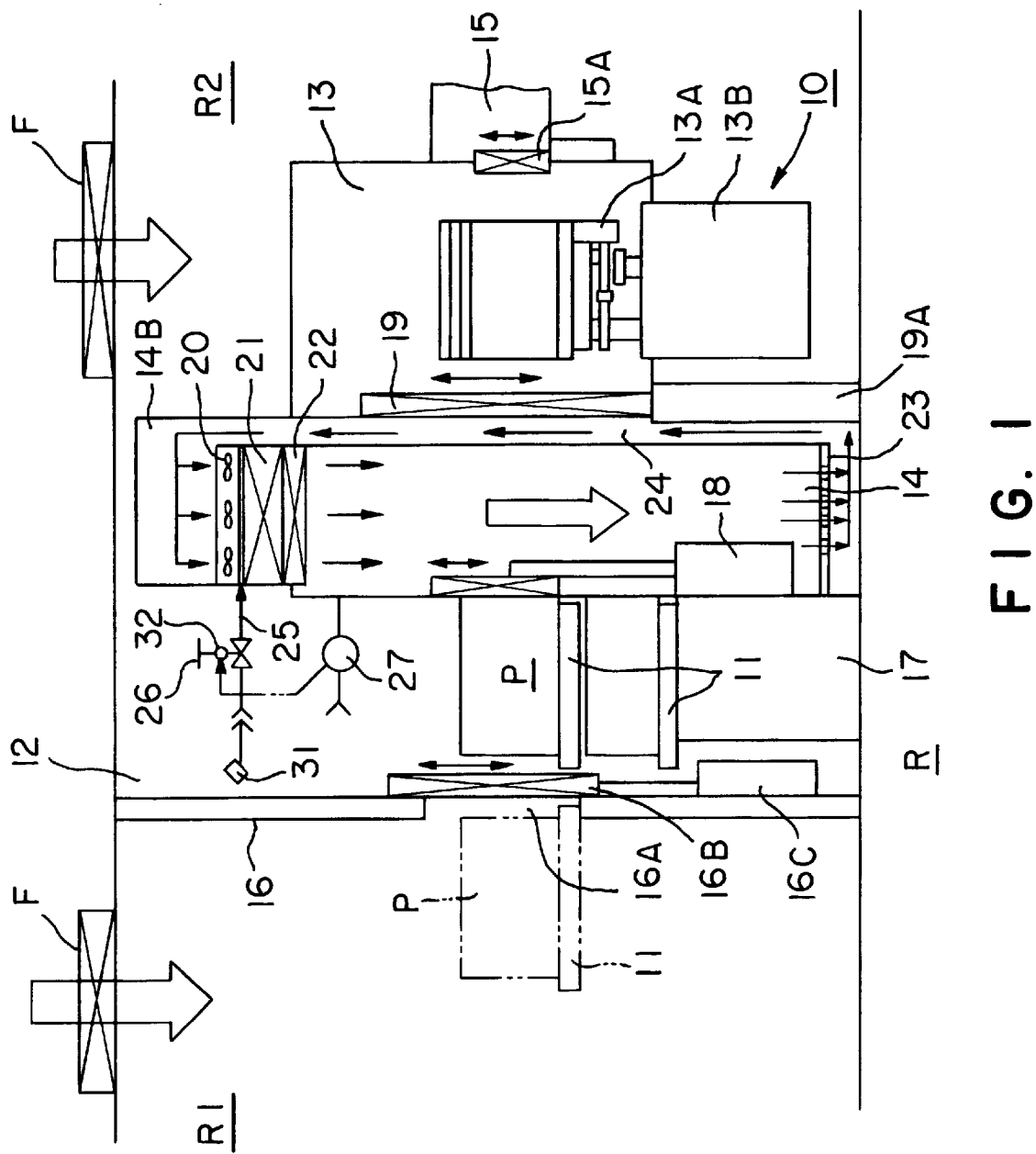
F I G. 1

CONTROLLING GAS IN A MULTICHAMBER PROCESSING SYSTEM

FIELD OF THE INVENTION

This invention relates to a processing system and a method of controlling a gas in a processing system for processing an object such as a wafer as part of a step for processing semiconductor devices.

BACKGROUND OF THE INVENTION

In the process to manufacture semiconductor devices, there is a trend that semiconductor wafers to be processed change from the current 6 or 8 inch wafers directly to 300 mm wafers. Thus, semiconductor manufacturing systems which can deal with 300 mm wafers have been developed. In 300 mm wafers, not only the diameter and the weight of the wafers have increased, but the width of lines in integrated circuits formed on the wafer have become ultraminute to not more than a sub-quarter-micron. Therefore, in semiconductor manufacturing plants, ultracleaning technology for clean rooms and automatic conveying technology for the wafers has become more important.

In the case of wafers up to 8 inches, the carrier for the wafers is conveyed usually with the wafers in upright attitude when conveying the wafers from one step to another, while the wafers are usually kept horizontal when conveying them into and out of processing units of the semiconductor production equipment. The operation of conveying the carriers into and out of the units is achieved by an operator or AGV (automatic guided vehicle). However, in the case of wafers of 300 mm, if the wafers are conveyed in an upright stance, the lower edges of the wafers may be damaged by the weight of the wafers, vibrations during conveying or the like. Therefore, the carrier is conveyed with the wafers kept horizontal. The operation of conveying into and out of the unit is difficult for the operator to achieve because of the weight of the wafers and the problem of generation of particles. Therefore an automatic operation is being promoted.

In the case of wafers up to 8 inches, after the load-lock chamber in which the carrier is placed is brought to a certain degree of vacuum, the wafers are conveyed one after another through a conveying chamber to a certain processing chamber. However, in the case of 300 mm wafers, the carrier capacity is large so that it takes much time to bring the load-lock chamber to a vacuum state. In addition, the vacuum causes, organic compound gases and the like are withdrawn from the plastic parts of the carrier, thereby polluting the inside of the unit with impurity gases. Therefore, in processing systems which deal with 300 mm wafers, a cleaning chamber is provided between a carrier-housing chamber and a load-lock chamber so that the wafers are first conveyed into the load-lock chamber from the carrier positioned in the carrier-housing chamber by a conveying unit placed in the load-lock chamber. The wafers are then conveyed through a conveying chamber into each processing chamber one by one. Thus carriers adapted for 300 mm wafers are required. At the present time, carriers can be roughly classified into an open-type carrier and a closed-type pod (for example, an unified pod) which is closed with a lid after putting the carrier therein.

For example, as shown in FIG. 4, the above processing system comprises a tray 1 for receiving a pod P which houses 13 or 25 wafers, a carrier-housing chamber 2 for housing the retracted tray 1 on which the pod P is put, and a load-lock chamber 3 having a wafer conveying unit (not shown) which conveys wafers in a bunch into and out of the pod P in the carrier-housing chamber 2. Furthermore, a cleaning chamber 5 is provided between the carrier-housing chamber 2 and the load-lock chamber 3 to clean the atmosphere of the wafer passage line. To the load-lock chamber 3 is connected a conveying chamber 4 via a gate-valve so that the wafers in the load-lock chamber 3 are conveyed into the processing chamber for wafers (not shown) through the conveying chamber 4 one by one. This processing system is provided in a unit area R2 which is divided from a common area R1 by a front panel 6 in a clean room R.

At the ceiling of the clean room R, a high-performance filter F such as a ULPA filter or a HEPA filter is placed so that air cleaned by the high-performance filter F flows downward in the clean room R. This processing system introduces air in the unit area R2 into the cleaning chamber 5 by a suction fan (not shown) provided in the cleaning chamber 5; cleans the air with a high-performance filter provided on a downstream side of the suction fan, similar to the above high-performance filter; causes the air to flow downward in the cleaning chamber 5 as shown by arrows in FIG. 4; and discharges the air from the bottom to the outside. In the cleaning chamber 5, an opener 7 is arranged as shown in FIG. 4. This processing system opens the lid of the pod P by the opener 7, conveys wafers W in the pod P in a lump through the cleaning chamber 5 into the load-lock chamber 3 by the wafer conveying unit in the load-lock chamber 3, keeps all the wafers W horizontal in the load-lock chamber 3, and conveys the wafers held by the conveying unit through the conveying chamber 4 into the processing chamber. At each transfer port of the wafers in the load-lock chamber 3 and in the conveying chamber 4, a gate-valve (not shown) is arranged.

In the case of the above described conventional processing system, there are some problems owing to introducing the air in the unit area R2 into the cleaning chamber 5. In the unit area R2, unlike the common area R1, various units are ordinarily provided. Consequently, particles may be produced from these units or organic gases such as an organic solvents consisting by of hydrocarbons may be produced as impurity gases from the painted portions of these units. Because of this, the air in the unit area R2 becomes polluted by these impurities, and the air in the unit area R2 is inferior in cleanliness to that in the common area R1. If the air in the unit area R2 is introduced into the cleaning chamber 5 as it is, even though the particles can be removed by a high-performance filter in the cleaning chamber 5, the impurity gases can not be removed, so that the impurity gases may adhere to the surfaces of the wafers W, thereby disturbing the processing of the wafers W and reducing the yield in the process. The more ultraminute the processing of wafers W is, the greater influence of particles and the impurity gases. In addition, if air is introduced, oxygen in the air produces oxidation films on the surfaces of the wafers W and moisture in the air flows through the cleaning chamber 5 into the load-lock chamber 3 to adhere to the walls of the load-lock chamber 3. This brings about an adverse influence in that the length of time needed to bring the load-lock chamber 3 to a vacuum state becomes long.

SUMMARY OF THE INVENTION

Therefore, an object of this invention is to provide a processing system and a method of controlling a gas in a processing system which can prevent drop of the yield by preventing impure gases from adhering to the object to be processed therein.

In this invention, a processing system provided in a unit area which is divided from a common area by a partition, for processing an object to be processed which is conveyed by a conveying container for an object from the common area, comprising; a container-housing chamber for housing the conveying container conveyed from the common area; a cleaning chamber provided adjacent to the container-housing chamber; and a load-lock chamber provided adjacent to the cleaning chamber; wherein the cleaning chamber has an inlet line for introducing clean gas into the cleaning chamber and a pressure control means for controlling a pressure in the cleaning chamber; and the load-lock chamber has a conveying unit capable of extending to the container-housing chamber through the cleaning chamber, in order to take out the object from the conveying container housed in the container-housing chamber to the load-lock chamber through the cleaning chamber.

This invention is characterized by another feature that the pressure control means comprises; a valve for adjusting a flow rate of the gas in the inlet line, a differential pressure gauge for detecting a differential pressure between a pressure in the cleaning chamber and the atmospheric pressure, and a valve-controller for adjusting an opening degree of the valve so that the pressure in the cleaning chamber is a positive pressure, based on a result of the detecting by the differential pressure gauge.

This invention is characterized by another feature that the cleaning chamber is provided at a portion close to an edge on the side of a cleaning chamber of the inlet line, and has a ventilating means for ventilating the clean gas introduced by the inlet line into the cleaning chamber. Further the cleaning chamber preferably comprises; a circulation line for circulating the gas ventilated by the ventilating means in the cleaning chamber; and a filter provided in the circulation line, for removing particles or an impurity gas from the gas circulating in the circulation line.

This invention is characterized by another feature that the inlet line connects the cleaning chamber with the common area to introduce the clean gas into the cleaning chamber from the common area, or by another feature that the system comprises an inert gas supplier, and the inlet line connects the cleaning chamber with the inert gas supplier to introduce the clean gas into the cleaning chamber from the inlet gas supplier.

On the other hand, in this invention, a method of controlling a gas in a processing system provided in a unit area which is divided from a common area by a partition, for processing an object to be processed which is conveyed by a conveying container for an object from the common area, comprising, a container-housing chamber for housing the conveying container conveyed from the common area, a cleaning chamber provided adjacent to the container-housing chamber, and a load-lock chamber provided adjacent to the cleaning chamber, wherein the cleaning chamber has an inlet line for introducing clean gas into the cleaning chamber and a pressure control means for controlling a pressure in the cleaning chamber, the load-lock chamber has a conveying unit capable of extending to the container-housing chamber through the cleaning chamber, in order to take out the object from the conveying container housed in the container-housing chamber to the load-lock chamber through the cleaning chamber, said method comprises the steps of: introducing the clean gas from the common area through the inlet line into the cleaning chamber; and maintaining a pressure in the cleaning chamber positive by the pressure control means.

This invention is characterized by another feature that the method further comprises the steps of: discharging the gas introduced into the cleaning chamber; and introducing again the discharged gas into the cleaning chamber thorough a filter.

Further, in this invention, another method of controlling a gas in a processing system provided in a unit area which is divided from a common area by a partition, for processing an object to be processed which is conveyed by a conveying container for an object from the common area, comprising, a container-housing chamber for housing the conveying container conveyed from the common area, a cleaning chamber provided adjacent to the container-housing chamber, a load-lock chamber provided adjacent to the cleaning chamber, and an inert gas supplier, wherein the cleaning chamber has an inlet line for introducing clean gas into the cleaning chamber and a pressure control means for controlling a pressure in the cleaning chamber, the load-lock chamber has a conveying unit capable of extending to the container-housing chamber through the cleaning chamber, in order to take out the object from the conveying container housed in the container-housing chamber to the load-lock chamber through the cleaning chamber, said method comprises the steps of: introducing the inert gas from the inert gas supplier through the inlet line into the cleaning chamber, and maintaining a pressure in the cleaning chamber positive by the pressure control means.

This invention is characterized by another feature that the method further comprises the steps of: discharging the inert gas introduced into the cleaning chamber; and introducing again the discharged inert gas into the cleaning chamber thorough a filter.

BRIEF DESCRIPTION OF THE DRAWINGS

FIG. 1 is a schematic sectional view of a wafer transfer section, in an embodiment of the processing system according to the invention;

BEST MODE FOR CARRYING OUT THE INVENTION

Figure 2:
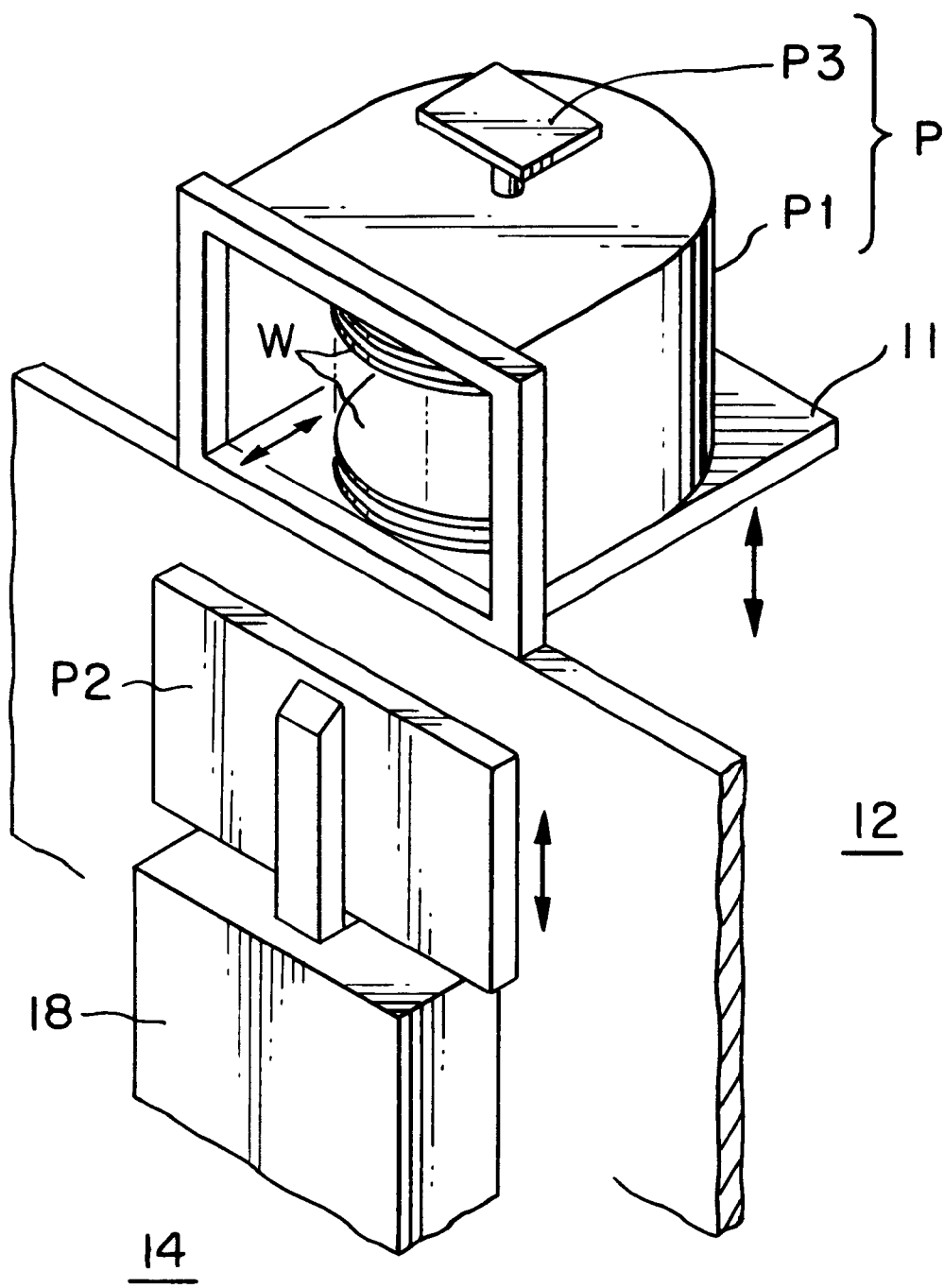
FIG. 2 is a perspective view of a pod with its lid being opened by an opener shown in FIG. 1.

An embodiment of the invention will now be described in more detail with reference to FIG. 1 and FIG. 2.

The embodiment of the processing system 10 according to the invention comprises, as shown in FIG. 1, a tray 11 for supporting a pod P which houses wafers (objects to be processed), a carrier-housing chamber 12 (container-housing chamber) for housing a retracted tray 11 on which the pod P is put, and a load-lock chamber 13 having a wafer conveying unit 13A which conveys wafers in a bunch into and out of the pod P in the carrier-housing chamber 12. A cleaning chamber 14 is arranged between the carrier-housing chamber 12 and the load-lock chamber 13. To the load-lock chamber 13 is openly connected a conveying chamber 15 so that wafers in the load-lock chamber 13 can be conveyed into a wafer processing chamber (not shown) through the conveying chamber 15 one by one. The conveying chamber 15, plural processing chambers are openly connected to each other so that wafers W in the load-lock chamber 13 can be conveyed one by one into each processing chamber, for example through the conveying unit (not shown) in the conveying chamber 15. The reference sign 13B in FIG. 1 indicates a drive mechanism for the wafer conveying unit 13A.

As shown in FIG. 2, the pod P comprises a main body P1 and a lid P2 for closing the opening in the main body P1. The pod P is adapted to house 13 or 25 wafers of 300 mm and to be closed tightly by a synthetic resin such as PEEK (Poly-Ether-Ether-Keton). When the wafers are transported, nitrogen or other such gas is introduced into the pod P to keep its inside clean and to seal the inside from the outside thus preventing the wafers from being oxidized naturally as much as possible. On the upper surface of the pod P, a holding part P3 is attached. The carrier conveying unit which moves along a rail arranged on the ceiling of the clean room R, holds onto the holding part P3 and conveys the pod P between processing units. The reference sign F in FIG. 1 indicates the high-performance filter.

On the front surface of this embodiment of the processing unit 10, a front panel 16 is arranged. The front panel 16 divides the clean room R into a common area R1 and a unit area R2. In the front panel 16, a transfer port 16A is formed for conveying the pod P into and out of the carrier-housing room 12. The tray 11 moves through the transfer port 16A between a forward position shown by the solid line in FIG. 1 and a backward position shown by the chain line in FIG. 1. The plural trays 11 are provided vertically so that each tray 11 stops at the transfer port 16A by an elevator mechanism 17. At the front panel 16, an opening/closing door 16B is arranged. The opening/closing door 16B opens and closes the transfer port 16A by sliding in the direction of the arrows in FIG. 1 and is driven by drive mechanism 16C. The common area R1 is formed as an area for the operator to operate the processing unit 10 and is an area for the AGV to convey the pod P.

A wafer transfer port (not shown) is formed in the wall on the side of the carrier-housing chamber 12 of the cleaning chamber 14 for conveying wafers. The wafer transfer port is fitted with the lid P2 of the pod P. Below the wafer transfer port, a lid opener 18 is arranged. This opener 18 can open/close the lid P2 of the pod P as shown in FIG. 2. On the wall on the opposite side to the opener 18, a gate-valve 19 driven by a drive mechanism 19 A is mounted. The gate-valve 19 is opened when conveying the wafers, and closed after conveying the wafers in order to seal the load-lock chamber 18. Accordingly, after the lid P2 of the pod P is opened by the opener 18 and the gate-valve 19 is opened, the wafer conveying unit 13A is driven to convey in a bunch 13 or 25 wafers from the pod P into the load-lock chamber 13 where they are held horizontally. Next the opener 18 and the gate-valve 19 are closed and the transfer port 15A of the conveying chamber 15 is opened. The conveying unit in the conveying chamber 15 is then driven to take out wafers one by one from the wafer conveying unit 13A and to convey them through the conveying chamber 15 into various processing units. In the processing units, etching, film forming or the like is conducted on the wafers.

In the upper portion of the above cleaning chamber 14, a ventilating fan 20, a high-performance filter 21 and a chemical filter 22 are arranged vertically in this order from top to bottom. The high-performance filter 21 is an ULPA filter or a HEPA filter or the like. The chemical filter 22 consists of an absorbent substance such as an active carbon in a particulate or fibrous state to absorb impurity gases chemically. At the lower portion of the cleaning chamber 14, a floor 23 having a number of dispersed holes is arranged horizontally, so that the gas flowing downward by the ventilating fan 20 goes though the floor 23, returns through a circulating duct 24 to an upper space 14B above the ventilating fan 20 in the cleaning chamber 14, and the gas flow circulates through the cleaning chamber 14 as shown by arrows in FIG. 1. An inert gas supplier 31 for supplying an inert gas such as nitrogen or argon or the like is connected to the cleaning chamber 14 through a connecting duct 25. The edge of the connecting duct 25 on the side of the cleaning chamber 14 is disposed between the ventilating fan 20 and the high-performance filter 21 to disperse the inert gas wholly between the ventilating fan 20 and the high-performance filter 21. Accordingly the inert gas flows downward in the cleaning chamber 14 through both the high-performance filter 21 and the chemical filter 22 without turbulence and circulates back to the cleaning chamber 14 through the above line as a laminar flow.

The pressure of the inert gas in the cleaning chamber 14 at this stage can be set to any pressure higher than the atmospheric pressure. This is achieved by a pressure control valve 26 having a valve-controller 32 attached to the above connecting duct 25, and a differential pressure gauge 27 attached in the cleaning chamber to detect the difference between the inside pressure of the cleaning chamber 14 and the atmospheric pressure. The differential pressure gauge 27 continually detects the pressure of the inert gas in the cleaning chamber 14 detects the difference from the atmospheric pressure. The differential pressure gauge 27 is connected to the valve-controller 32 which continually keeps the pressure of the inert gas in the cleaning chamber 14 positive, that is, higher than the atmospheric pressure. Therefore, if the pressure of the inert gas in the cleaning chamber 14 becomes close to or lower than the atmospheric pressure, the valve-controller 32 enlarges the opening degree of the pressure control valve 26 in accordance with the value detected by the differential pressure gauge 27 to increase the flow rate of the inert gas thereby keeping the pressure of the inert gas positive. By keeping the pressure of the inert gas in the cleaning chamber 14 positive, the air in the unit area R2 is prevented from flowing into the cleaning chamber 14.

The method for controlling gas and the operation of the processing system according to this invention will be described below. When processing wafers with the processing unit 10, the opening/closing door 16B of the front panel 16 is opened, the tray 11 is drawn out from the transfer port 16A, and the pod P is placed on the tray 11. Then the tray 11 moves back into the carrier-housing chamber 12 and the drive mechanism 16C operates to close the opening/closing door 16B thereby sealing off the transfer port 16A. Next, the opener 18 in the cleaning chamber 14 operates to open the lid P2 of the pod P as shown in FIG. 2, and the gate-valve 19 of the load-lock chamber 13, driven by the drive mechanism 19A, operates to open the transfer port. As a result, the pod P, the cleaning chamber 14 and the load-lock chamber 13 are linked together to make a single space. An inert gas such as nitrogen is supplied from the supplier 31 into the cleaning chamber 14, thereby filling the pod P, the cleaning chamber 14 and the load-lock chamber 13 with very clean nitrogen gas. At this stage, the cleaning chamber 14 is the only space having a positive pressure so pressure is reduced when the pod P, the cleaning chamber 14 and the load-lock chamber 13 are connected together. However, when the pressure falls below a certain value, the valve-controller 32 opens or enlarges the opening of the pressure control valve 26 in accordance with a signal based on the readings detected by the differential pressure gauge 27, thereby letting extra nitrogen gas into the space. Consequently, the pressure of the unified space is maintained at certain positive pressure.

Under the above positive pressure, the wafer conveying unit 13A in the load-lock chamber 13 is driven by the drive mechanism 13B to convey the wafers in the pod P into the load-lock chamber 13 in a bunch. At this point, the wafers pass through the cleaning chamber 14. If particles are produced from the opener 18 or a moving part of the wafer conveying unit 13A, or if an organic impurity gases are produced from the lubricating oil of the drive mechanism or the like, the impurities will not adhere to the surfaces of the wafers resulting in a reduction in the processing yield. This is because the unified space is always filled with circulating nitrogen gas and when this gas flows through the cleaning chamber 14, impurities are removed by the high-performance filter 21 or the chemical filter 22.

The wafer conveying unit 13A horizontally supports 13 or 25 wafers in such a way that the gap between two adjacent wafers is very small, thereby preventing inert gas from flowing between the wafers. This enables all wafers to pass through the cleaning chamber 14, while staying as clean as they were when in the pod P. Furthermore, there is no fear of impure air from the unit area R2 flowing into the cleaning chamber 14 and contaminating the wafers with impurities as the cleaning chamber 14 is always maintained at a positive pressure and kept in a clean state, even if the cleaning chamber 14 is not closed fully.

After the wafers are conveyed into the load-lock chamber 13 as mentioned above, the opener 18 operates the lid P2 to tightly seal the pod P in the cleaning chamber 14, and the drive mechanism 19A operates gate-valve 19 to close the transfer port of the load-lock chamber 13. As a result, the cleaning chamber 14 and the load-lock chamber 13 are shut off from each other. The load-lock chamber 13 is then made into a vacuum state. After that, the gate-valve 15A of the conveying chamber 15 opens and the gate-valve for the conveying chamber 15 on the side of the processing chamber opens thereby connecting the load-lock chamber 13 and the conveying chamber 15. The conveying unit of the conveying chamber 15 is then driven to carry one by one the wafers held in the wafer conveying unit 13A into the appropriate processing chamber where they receive certain processes. When the wafers have finished being processed, they are taken out of the processing chamber and carried back to their original positions in the wafer conveying unit 13A in the load-lock chamber 13. When all the wafers have finished being processed, they are moved from the load-lock chamber 13 back into the pod P. The pod P is then moved back to the next step.

As above described, according to this embodiment, the processing system 10 comprises: an inert gas supplier 31; an inlet line 25 introducing clean inert gas into the cleaning chamber 14; a pressure control valve 26 having a valve-controller 32 for adjusting the flow rate of the inert gas in the inlet line 25; a differential pressure gauge 27 for detecting the difference in pressure between the cleaning chamber 14 and the atmosphere. The valve-controller 32 adjusts the opening of the pressure control valve 26 in accordance with the value detected by the differential gauge 27. The inert gas is also passed through a high performance filter 21 and a chemical filter 22. Thus highly pure inert gas is circulated through the cleaning chamber 14 while keeping the pressure positive. Under this system, when conveying wafers from the pod P to the load-lock chamber 13 by the wafer conveying unit 13A, there is no fear of particles or impurities polluting the wafers, even when they are passed through the cleaning chamber 14. And reductions in the wafer yield can be prevented, even if wafer processing systems become even more minute than they are now. In addition, no moisture can be introduced from the outside area and adhere to the inside walls of the load-lock chamber 13 as there is no moisture in the inert gas supplied from the inert gas supplier. Because of this the time required to bring the chamber in vacuum state is not long, and adverse influences caused by the moisture are prevented.

Figure 3:
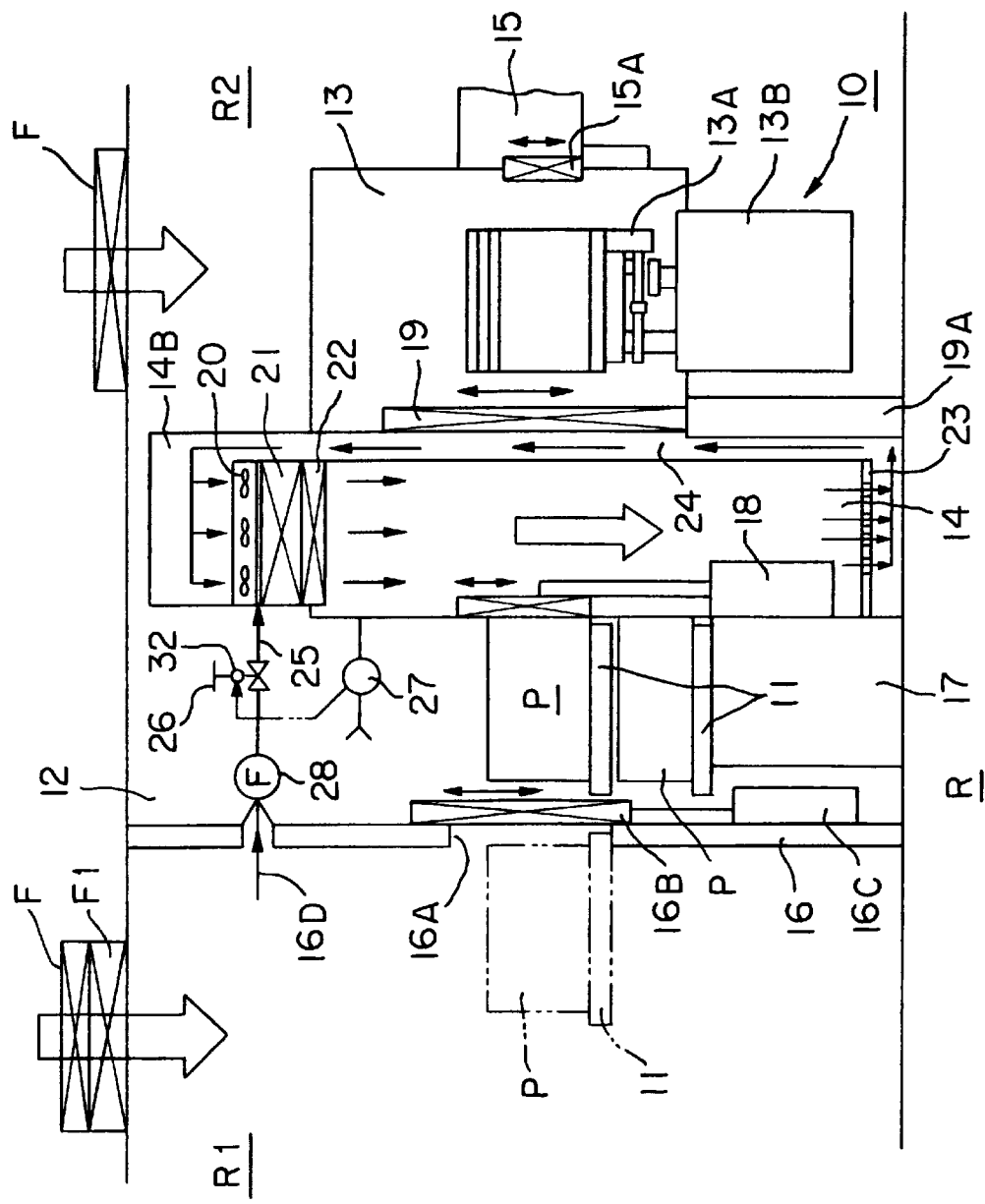
FIG. 3 is a schematic sectional view of a wafer transfer section, in another embodiment of the processing system according to the invention.
Figure 4:
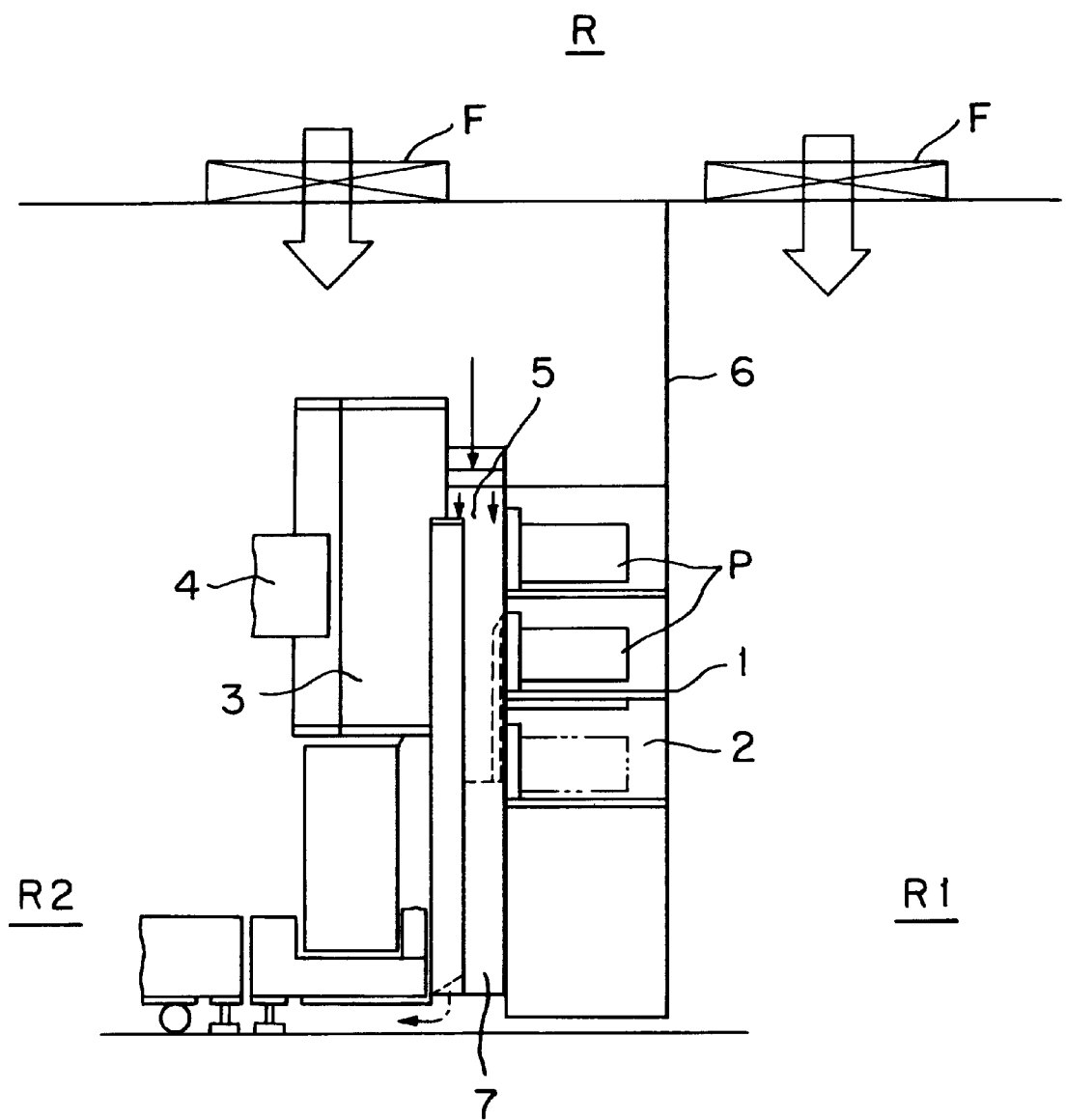
FIG. 4 is a schematic sectional view of an example of a conventional processing system.

FIG. 3 shows another embodiment of the invention. While the inert gas is introduced into the cleaning chamber 14 in the above embodiment, clean air from the common area R1 is introduced into the cleaning chamber 14 in this embodiment. All other configurations are the same as those in the above embodiment. This embodiment uses the same numeral references as those in the above embodiment on identical or similar portions of the invention. The features of this embodiment are as follows:.

Instead of an inert gas supply, an air inlet opening 16D is formed in a front panel 16, and an end of an introducing duct 25 is connected to the air inlet opening 16D. A suction fan 28 is mounted within this introducing duct 25. The suction fan 28 sucks in clean air from the common area R1 and conveys it to the cleaning chamber 14 thereby keeping the cleaning chamber 14 pressure positive. The other end of the connecting duct 25 is inserted between the ventilating fan 20 and the high-performance filter 21 as in the above embodiment. As in the above embodiment, a pressure control valve 26 having a valve-controller 32 is connected to the connecting duct 25, and a differential pressure gauge 27 is installed in the cleaning chamber 14. It is preferable to introduce air from the common area R1 into the cleaning chamber 14 when possibility that the air in the common area R1 being polluted by organic impurity gases such as hydrocarbon gas as is low, like the air in the unit area R2. When the possibility is low, there is no fear that the wafers is polluted by the impurity gases in the cleaning chamber 14, even when the air in the common area R1 is introduced into the cleaning chamber 14. If there is a possibility that the impure gases will mix mixed with the air in the common area R1, it is preferable to attach a chemical filter F1 below the high-performance filter F on the ceiling of the common area R1. However, as a certain amount of natural oxidation films may be formed on the wafers, if slight natural oxidation on films disturbs the following process, it is preferable to arrange the processing unit 10 according to the former embodiment.

According to the method for controlling gas in the processing unit 10A in this embodiment, clean air is introduced from the common area R1 in the clean room R into the cleaning chamber 14, and this air circulates through the filters while the pressure in the cleaning chamber 14 is kept positive. Because of this, any particles or impurity gases introduced in the air for any reason are removed reliably by the high-performance filter 21 and the chemical filter 22, thereby removing any fear of a reduction in the wafer processing yield. The other effects of the features are the same as those in the previous embodiment.

This invention is not limited by the above embodiments. The invention includes various techniques for introducing any type of clean gas into the cleaning chamber 14 and to circulate the introduced gas through filters while keeping the gas pressure positive. The objects to be processed are not limited to semiconductor wafers, but could be, for example, glass substrates.

What is claimed is:

1. A processing system provided in a unit area which is divided from a common area by a partition, for processing an object to be processed which is conveyed by a conveying container for an object from the common area, comprising:

a cleaning chamber to which the conveying container conveyed from the common area can be connected, the cleaning chamber having an opening for conveying the object there into or therefrom;

a load-lock chamber provided adjacent to the cleaning chamber which communicates with the cleaning chamber via a gate-valve the load lock chamber being able to be brought to a vacuum state;

a conveying unit capable of taking out the object from the conveying container to the load-lock chamber;

an inlet line for introducing a clean inert gas into the cleaning chamber;

a pressure control means for maintaining a pressure in the cleaning chamber at a positive pressure;

a ventilating fan arranged at an upper portion of the cleaning chamber, for causing gas in the cleaning chamber to flow downward;

a circulating duct for causing the gas to circulate from a lower portion of the cleaning chamber to an upstream portion of the ventilating fan;

a high-performance filter arranged at a downstream portion of the ventilating fan in the upper portion of the cleaning chamber, for removing particles from the gas; and a chemical filter arranged at a downstream portion of the ventilating fan in the upper portion of the cleaning chamber, for removing an impurity gas from the gas;

wherein the inlet line is connected to a narrow portion of the cleaning chamber between the ventilating fan and the two filters.

2. A processing system according to claim 1, wherein:

the pressure control means comprises;

a valve for adjusting a flow rate of the gas in the inlet line, a differential pressure gauge for detecting a differential pressure between the pressure in the cleaning chamber and the atmospheric pressure, and a valve-controller for adjusting an opening degree of the valve so that the pressure in the cleaning chamber is maintained at the positive pressure, based on a result of the detecting by the differential pressure gauge.

3. A processing system according to claim 1, wherein:

the pressure control means comprises;

a suction fan for sucking the clean air from the common area, a valve for adjusting a flow rate of the gas in the inlet line, a differential pressure gauge for detecting a differential pressure between the pressure in the cleaning chamber and the atmospheric pressure, and a valve-controller for adjusting an opening degree of the valve so that the pressure in the cleaning chamber is maintained at the positive pressure, based on a result of the detecting by the differential pressure gauge.

4. A processing system provided in a unit area which is divided from a common area by a partition, for processing an object to be processed which is conveyed by a conveying container for an object from the common area, comprising:

a cleaning chamber to which the conveying container conveyed from the common area can be connected, the cleaning chamber having an opening for conveying the object there into or therefrom;

a load-lock chamber provided adjacent to the cleaning chamber which communicates with the cleaning chamber via a gate-valve, the load-lock chamber being able to be brought to a vacuum state;

a conveying unit capable of taking out the object to a vacuum state;

a conveying unit capable of taking out the object from the conveying container to the load-lock chamber;

an inlet line for introducing a clean air from the common area into the cleaning chamber;

a pressure control means for maintaining a pressure in the cleaning chamber at a positive pressure;

a ventilating fan arranged at an upper portion of the cleaning chamber, for causing gas in the cleaning chamber to flow downward;

a circulating duct for causing the gas to circulate from a lower portion of the cleaning chamber to an upstream portion of the ventilating fan;

a high-performance filter arranged at a downstream portion of the ventilating fan in the upper portion of the cleaning chamber, for removing particles from the gas; and a chemical filter arranged at a downstream portion of the ventilating fan in the upper portion of the cleaning chamber between the ventilating fan and the two filters, wherein the inlet line is connected to a narrow portion of the cleaning chamber between the ventilating fan and the two filters.

* * * * *